United States Patent
Zheng

(10) Patent No.: US 7,948,052 B2
(45) Date of Patent: May 24, 2011

(54) DUAL-BIT MEMORY DEVICE HAVING TRENCH ISOLATION MATERIAL DISPOSED NEAR BIT LINE CONTACT AREAS

(75) Inventor: Wei Zheng, Santa Clara, CA (US)

(73) Assignee: Spansion LLC, Sunnyvale, CA (US)

( * ) Notice: Subject to any disclaimer, the term of this patent is extended or adjusted under 35 U.S.C. 154(b) by 1 day.

(21) Appl. No.: 11/612,413

(22) Filed: Dec. 18, 2006

(65) Prior Publication Data

US 2008/0144366 A1 Jun. 19, 2008

(51) Int. Cl.
*H01L 27/10* (2006.01)

(52) U.S. Cl. .............................. 257/510; 257/E27.103

(58) Field of Classification Search ............... 257/510, 257/E27.103
See application file for complete search history.

(56) References Cited

U.S. PATENT DOCUMENTS

| | | | |
|---|---|---|---|
| 6,232,181 B1 * | 5/2001 | Lee | 438/257 |
| 6,271,088 B1 * | 8/2001 | Liu et al. | 438/259 |
| 6,492,677 B2 * | 12/2002 | Takahashi et al. | 257/316 |
| 6,587,387 B1 * | 7/2003 | Fan et al. | 365/201 |
| 6,828,623 B1 * | 12/2004 | Guo et al. | 257/321 |
| 2003/0141532 A1 | 7/2003 | Kato | |
| 2004/0079984 A1 | 4/2004 | Kao et al. | |
| 2004/0082198 A1 | 4/2004 | Nakamura et al. | |
| 2004/0252541 A1 * | 12/2004 | Yang et al. | 365/102 |
| 2005/0006694 A1 | 1/2005 | Liu | |
| 2005/0014338 A1 | 1/2005 | Kim et al. | |
| 2006/0131613 A1 | 6/2006 | Kim et al. | |

FOREIGN PATENT DOCUMENTS

| | | |
|---|---|---|
| DE | 10246343 A1 | 4/2004 |
| JP | 11186528 | 7/1999 |
| JP | 2003224213 | 8/2003 |
| JP | 2004039866 | 2/2004 |
| JP | 2004111737 | 4/2004 |
| JP | 2004193178 | 7/2004 |
| JP | 2004349312 | 12/2004 |

OTHER PUBLICATIONS

Chang et al. "New Buried Bit-line NAND (BiNAND) Flash Memory for Data Storage." 2003 Symposium on VLSI Technology Digest of Technical Papers. pp. 95-96.*

* cited by examiner

*Primary Examiner* — Benjamin P Sandvik
*Assistant Examiner* — W. Wendy Kuo

(57) ABSTRACT

A dual-bit memory device is provided which includes trench isolation material disposed near bit line contact areas. For example, in one implementation a semiconductor memory device is provided in which each memory cell can store two bits of information. The memory device comprises a substrate, first and second buried bit lines in the substrate, a first bit line contact on the first buried bit line, a second bit line contact on the second buried bit line, and an insulator region disposed in the substrate between the first buried bit line and the second buried bit line. The insulator region prevents a current from flowing between the first buried bit line and the second buried bit line.

10 Claims, 6 Drawing Sheets

DUAL-BIT MEMORY DEVICE HAVING TRENCH ISOLATION MATERIAL DISPOSED NEAR BIT LINE CONTACT AREAS

FIELD OF THE INVENTION

The present invention generally relates to memory devices, and more particularly relates to dual-bit memory devices.

BACKGROUND OF THE INVENTION

Flash memory is a type of electronic memory media that can hold its data in the absence of operating power. Flash memory can be programmed, erased, and reprogrammed during its useful life (which may be up to one million write cycles for typical flash memory devices). Flash memory is becoming increasingly popular as a reliable, compact, and inexpensive nonvolatile memory in a number of consumer, commercial, and other applications. As electronic devices get smaller and smaller, it becomes desirable to increase the amount of data that can be stored per unit area on an integrated circuit memory cell, such as a flash memory unit.

One conventional flash memory technology is based upon a memory cell that utilizes a charge trapping dielectric cell that is capable of storing two bits of data. One example of this type of non-volatile memory device is known as a dual-bit Flash electrically erasable and programmable read-only memory (EEPROM), which is available under the trademark MIRRORBIT™ from Spansion, Inc., Sunnyvale, Calif. Such dual-bit memory cells utilize a single silicon nitride layer having two separate charge storage regions to store charge within the silicon nitride layer. In such an arrangement, one bit can be stored using a first charge storing region on one side of the silicon nitride layer, while a second bit can be stored using a second charge storing region on the other side of the same silicon nitride layer. For example, a left bit and right bit can be stored in physically different areas of the silicon nitride layer, near left and right regions of each memory cell, respectively. In comparison to a conventional EEPROM cell, a dual-bit memory cell can store twice as much information in a memory array of equal size.

FIG. 1 is a cross-sectional view of a conventional dual-bit memory cell 50. The memory cell 50 has a dual-bit (bit1, bit2) architecture that allows twice as much storage capacity as a conventional EEPROM memory device.

The conventional memory cell 50 includes a substrate 54, a first insulator layer 62 disposed over the substrate 54, a nitride charge storage layer 64 disposed over the first insulator layer 62, a second insulator layer 66 disposed over the charge storage layer 64, and a polysilicon control gate 68 disposed over the second insulator layer 66. To produce an operable memory device, a first metal silicide contact (not shown) can be disposed on substrate 54, and the control gate 66 can be capped with a second metal silicide contact (not shown).

In one implementation, the substrate 54 is a P-type semiconductor substrate 54 having a first buried junction region 60 and a second buried junction region 61 formed within substrate 54 in self-alignment with the memory cell 50. First buried junction region 60 and second buried junction region 61 are each formed from an N+ semiconductor material. The first insulator layer 62, the charge storage layer 64, and the second insulator layer 66 can be implemented using an oxide-nitride-oxide (ONO) configuration in which a nitride charge storage layer 64 is sandwiched between two silicon dioxide insulator layers 62, 66. Alternatively, charge storage layer 64 may utilize buried polysilicon islands as a charge trapping layer. The charge storage layer 64 is capable of holding a charge.

Memory cell 50 can store two data bits: a left bit represented by the circle (bit 1); and a right bit represented by the circle (bit 2). In practice, memory cell 50 is generally symmetrical, thus first buried junction region 60 and second buried junction region 61 are interchangeable. In this regard, first buried junction region 60 may serve as the source region with respect to the right bit (bit 2), while second buried junction region 61 may serve as the drain region with respect to the right bit (bit 2). Conversely, second buried junction region 61 may serve as the source region with respect to the left bit (bit 1), while first buried junction region 60 may serve as the drain region with respect to the left bit (bit 1).

While a single dual-bit memory cell 50 is illustrated in FIG. 1, it will be appreciated that any suitable number of the dual-bit memory cells 50 could be used to form a memory array, as described below with reference to FIG. 2.

FIG. 2 is a simplified diagram of a plurality of dual-bit memory cells arranged in accordance with a conventional array architecture 200 (a practical array architecture can include thousands of dual-bit memory cells 50). Array architecture 200 includes a number of buried bit lines formed in a semiconductor substrate as mentioned above. FIG. 2 depicts three buried bit lines (BLs) 202, 204, and 206, each being capable of functioning as a drain or a source for memory cells in array architecture 200. Array architecture 200 also includes a number of word lines (WLs) correspond to the gate of the memory cells and are utilized to control the gate voltage of the memory cells. FIG. 2 depicts four WLs 208, 210, 212, and 214 that generally form a crisscross pattern with the bit lines. Although not shown in FIG. 2, charge storage layer, such as an ONO stack, resides between the BLs and the WLs. The dashed lines in FIG. 2 represent two of the dual-bit memory cells in array architecture 200: a first cell 216 and a second cell 218. Notably, BL 204 is shared by first cell 216 and second cell 218. Array architecture 200 is known as a virtual ground architecture because ground potential can be applied to any selected BL and there need not be any BLs with a fixed ground potential.

Control logic and circuitry (not shown) for array architecture 200 governs the selection of memory cells, the application of voltage to the WLs 208, 210, 212, 214, and the application of voltage to the BLs 202, 204, 206 during conventional flash memory operations, such as: programming; reading; erasing; and soft programming. Voltage is delivered to the BLs 202, 204, 206 using BL contacts 230. FIG. 2 depicts three conductive metal lines 220, 222, and 224 and three BL contacts 226, 228, and 230. Because the resistance of the BLs 202, 204, 206 is very high, for a given BL 202, 204, 206, a BL contact is used, for example, once every 8, 16, or 256 WLs.

Referring again to FIG. 1, a memory cell can be programmed using hot electron injection techniques (also known as channel hot electron or CHE programming). In accordance with conventional programming techniques, the right bit 64 is programmed by applying a relatively high programming voltage to gate 68 via the appropriately selected WL, grounding the BL corresponding to first buried junction region 60 (which serves as the source in this case), and applying a relatively high drain bias voltage to the BL corresponding to second buried junction region 61 (which serves as the drain in this case). Conversely, the right bit 64 is programmed by applying a relatively high programming voltage to gate 68 via the appropriately selected WL, grounding the BL corresponding to second buried junction region 61 (which serves as the source in this case), and applying a relatively high drain bias voltage to the BL corresponding to first buried junction region 60 (which serves as the drain in this case).

Referring again to FIG. 2, conventional CHE programming of a flash memory array arranged in a virtual ground architecture may result in undesired BL to BL leakage current flowing under the unselected WLs, between the WLs, and in the BL contact areas. This BL to BL leakage current become increasingly worse as the cell size shrinks. Such BL leakage current can increase the required programming current. Moreover, the amount of this parasitic leakage current can be further increased due to natural degradation of the cells after the array has experienced many program-erase cycles. Excessive leakage current can be very undesirable in low power applications such as portable electronic devices, wireless telephones, or the like. Excessive leakage current may have other negative implications in a practical flash memory device. BL leakage current can also occur during conventional read and verification operations for virtual ground architecture (e.g., verification operations such as soft program verify, erase verify, and program verify) and adversely affect the read and verification results. Accordingly, it is desirable to control, reduce, or eliminate leakage current during programming of memory cells in a virtual ground architecture. In addition, it is desirable to control, reduce, or eliminate the leakage current component during read and verification operations of memory cells in a virtual ground architecture.

FIG. 3 is a simplified top view of a portion of a conventional array architecture 300 including a plurality of dual-bit memory cells. The array 300 has a "virtual ground layout" and comprises a plurality of bit lines 301-305, a plurality of word lines 308-372, and a plurality of bit line contacts 380-395. In the areas of the array 300 above the bit line contacts 380-395, there are no word lines present.

As noted above, it is desirable to control, reduce or eliminate BL-to-BL leakage currents ($I_L$). For instance, in the areas under the WLs 308-372, unwanted BL-to-BL leakage current ($I_L$) can be effectively controlled by applying appropriate bias voltage to the WLs 308-372. In addition, in the areas between adjacent or neighboring WLs 308-372, WL-to-WL leakage currents can also be controlled or shut off by the fringing field from the WLs 308-372 since the WL-to-WL distance is also very small. In other words, the fringing fields between the closely packed WLs 308-372 can also be used to control leakage currents between the WLs 308-372.

However, in the vicinity of the bit line contact areas 380-395 there are no WLs 308-370 which cover the bit line contact areas 380-395. The space occupied by the bit line contact areas 380-395 is relatively large in comparison to the dimensions of the WLs 308-370 and/or the spacings between the WLs 308-370. As such, in the regions 399 between the bit line contacts 380-395, leakage currents ($I_L$) can flow between adjacent or neighboring bit lines 301-305. Bit line leakage currents can also be problematic at the end of the array 300 where there are bit line contacts (not shown) which do not have corresponding WLs in the vicinity.

FIG. 4 is a simplified cross-sectional view of FIG. 3 taken along the line X-X' in FIG. 3. The cross-section 400 includes a substrate 354, buried bit lines 301, 302; spacers 372, insulator regions 374, and a plurality of bit line contacts 380, 382. The insulator regions 374 may comprise an insulator material such as an oxide or other insulator layer. For instance, the insulator regions 374 can be fabricated using a high density plasma (HDP) deposition technique to deposit an oxide on top of the bit lines 301, 302.

As memory cell size in the dual-bit memory device is scaled smaller (e.g., continues to shrink), the bit lines 301-305 are packed closer and closer together. As such, leakage current ($I_L$) issues become worse since the BL-to-BL distance separation decreases. Because WLs are not present in the vicinity of the BL contacts 380, 382, this makes it difficult to suppress leakage current ($I_L$) in the vicinity of the BL contacts 380, 382. For instance, the bit lines 301, 302 are susceptible to a leakage current ($I_L$) flowing between the adjacent or neighboring bit lines 301, 302.

Notwithstanding these advances, it would be desirable to provide improved techniques for reducing or preventing BL-to-BL leakage current in the BL contact area of a dual-bit memory cell. Furthermore, other desirable features and characteristics of the present invention will become apparent from the subsequent detailed description of the invention and the appended claims, taken in conjunction with the accompanying drawings and this background of the invention.

SUMMARY

A dual-bit memory device is provided which includes trench isolation material disposed near bit line contact areas. For example, in one implementation a semiconductor memory device is provided in which each memory cell can store two bits of information. The memory device comprises a substrate, first and second buried bit lines in the substrate, a first bit line contact on the first buried bit line, a second bit line contact on the second buried bit line, and an insulator region disposed in the substrate between the first buried bit line and the second buried bit line. The insulator region prevents a current from flowing between the first buried bit line and the second buried bit line.

BRIEF DESCRIPTION OF THE DRAWINGS

The present invention will hereinafter be described in conjunction with the following drawing figures, in which.

DETAILED DESCRIPTION AN EXEMPLARY EMBODIMENT

The following detailed description of the invention is merely exemplary in nature and is not intended to limit the invention or the application and uses of the invention. Furthermore, there is no intention to be bound by any theory presented in the preceding background of the invention.

Figure 1:
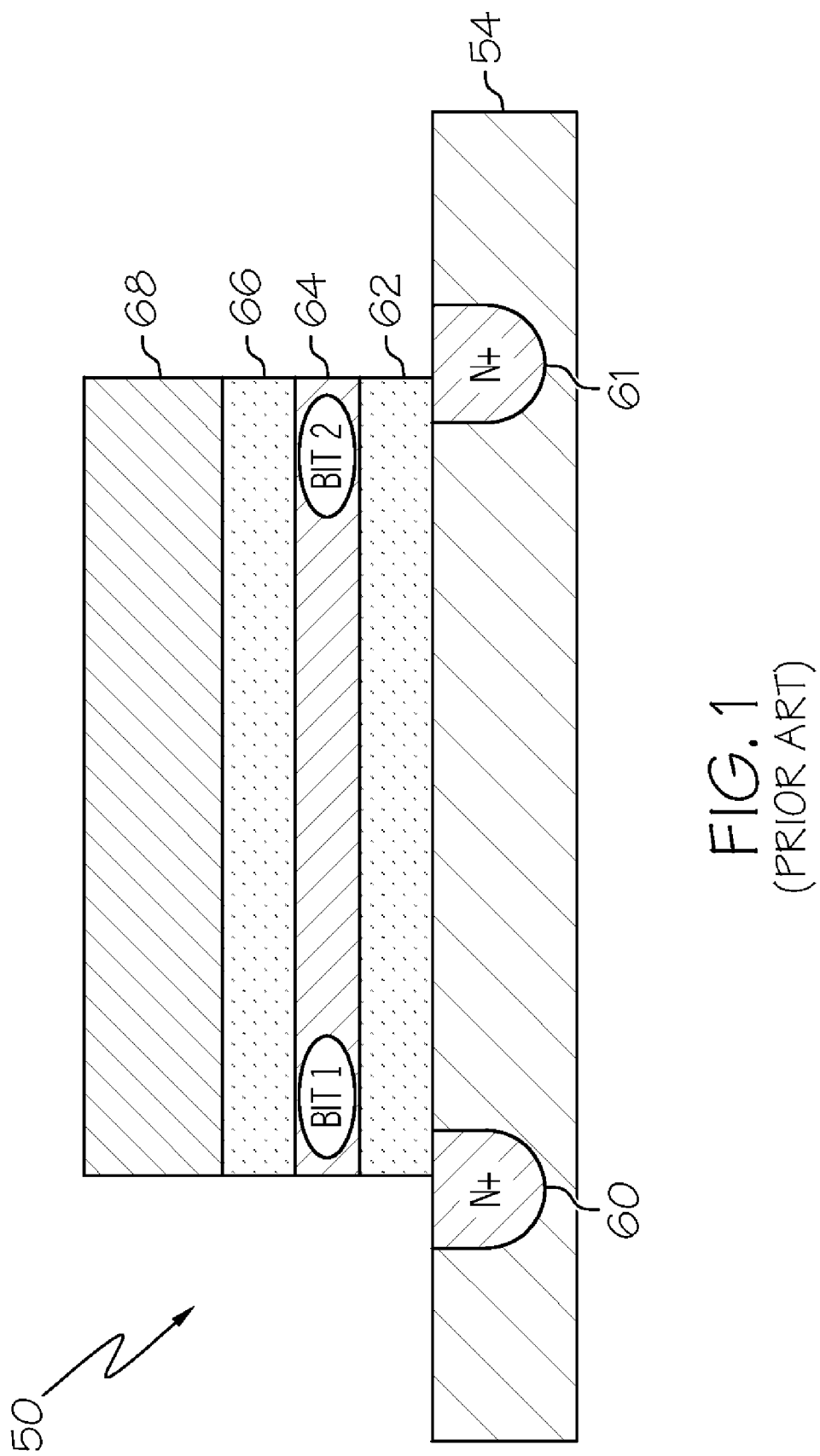
FIG. 1 is a simplified cross-sectional view of a conventional dual-bit memory cell.
Figure 2:
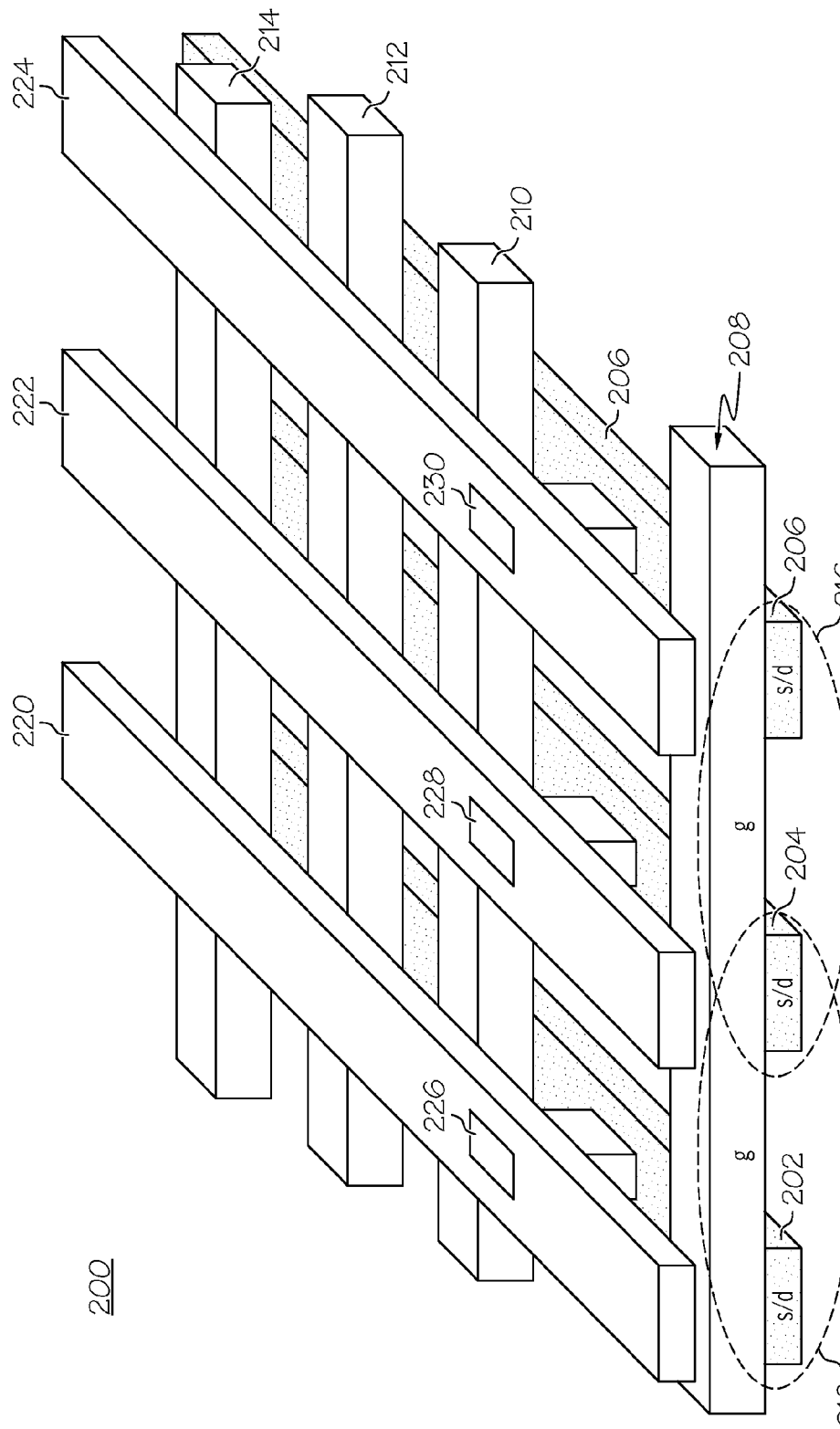
FIG. 2 is a simplified diagram of a plurality of dual-bit memory cells arranged in accordance with a conventional array architecture.
Figure 3:
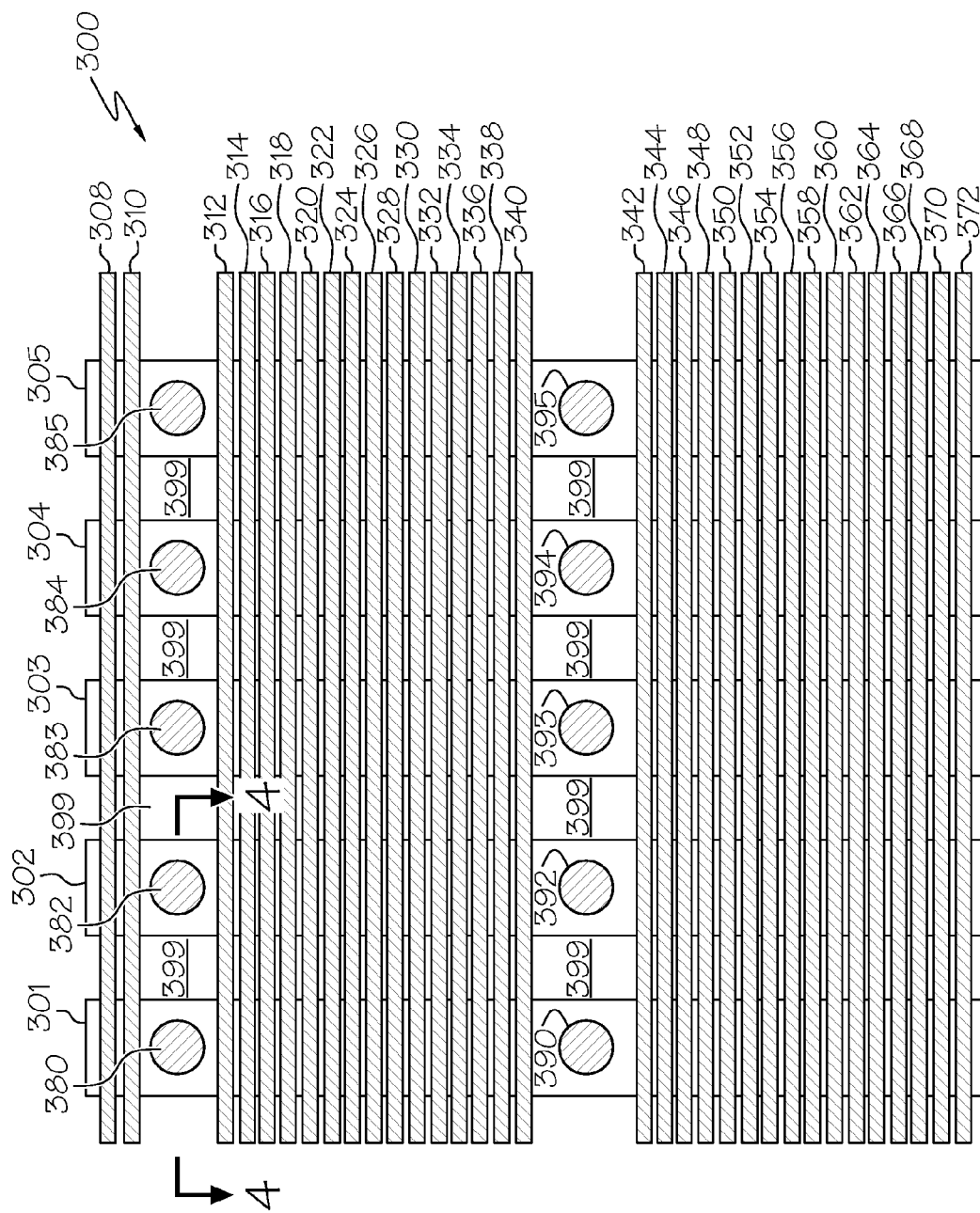
FIG. 3 is a simplified top view of a portion of a conventional array architecture including a plurality of dual-bit memory cells.
Figure 4:
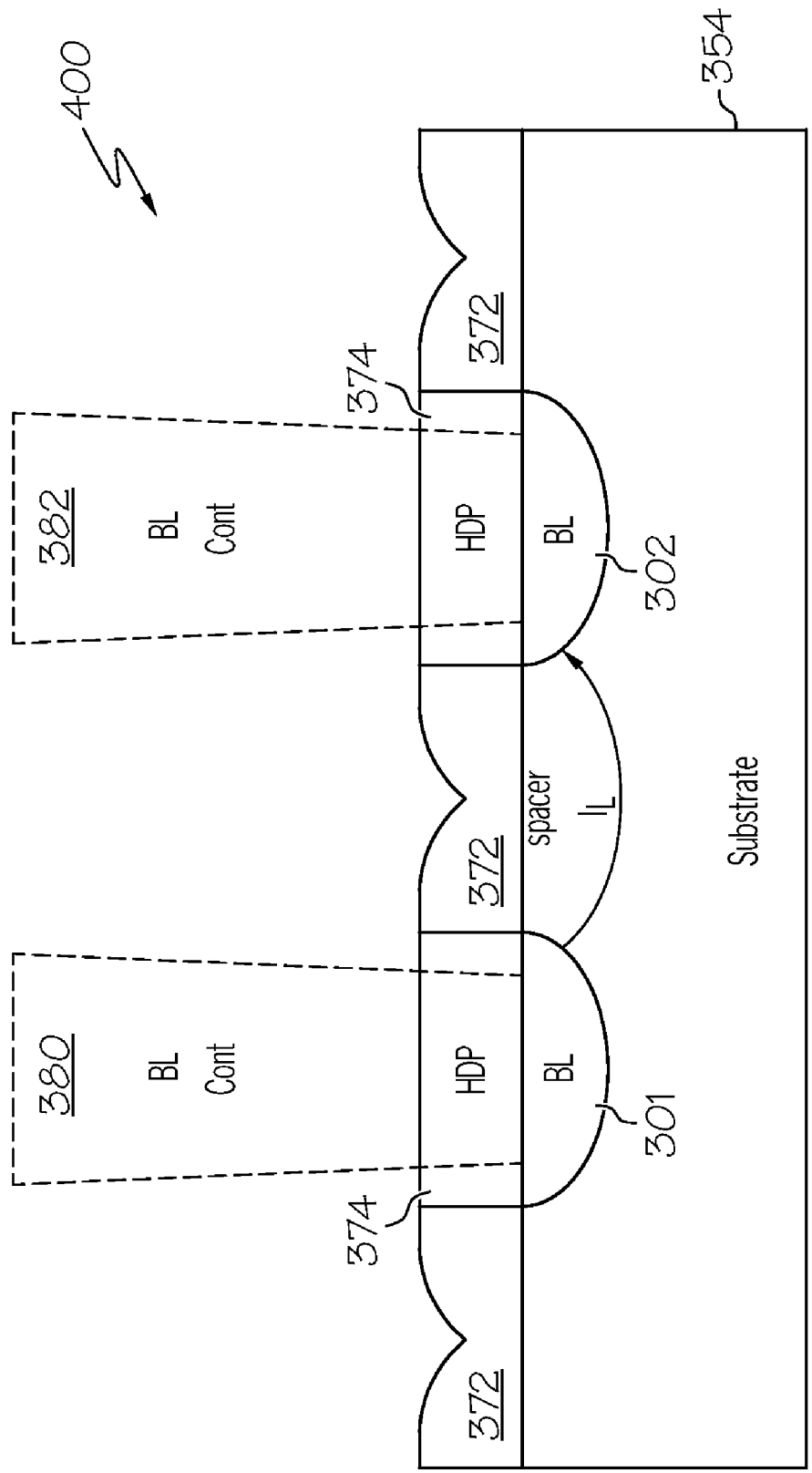
FIG. 4 is a simplified cross-sectional view of FIG. 3 taken along the line X-X'.
Figure 5:
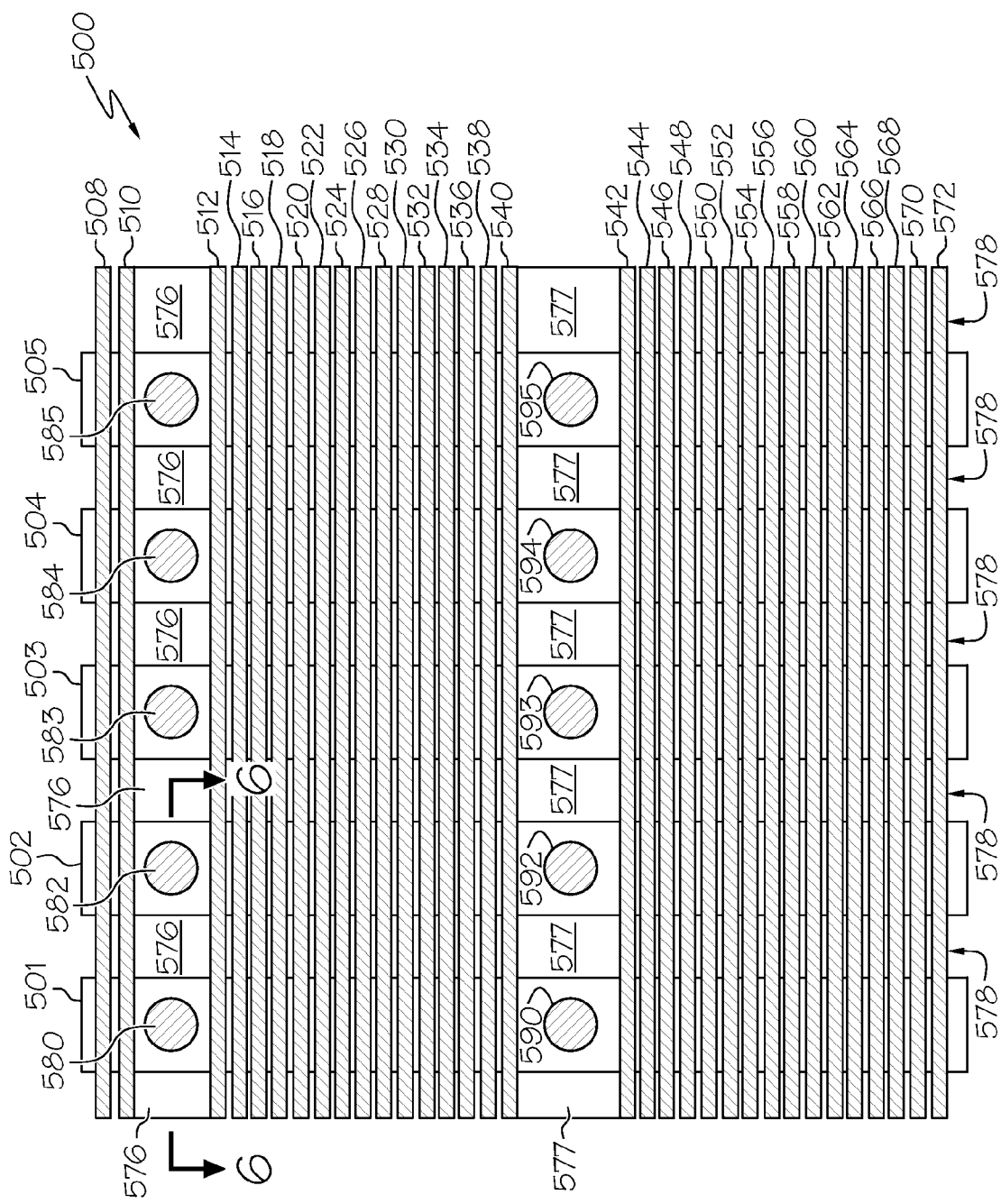
FIG. 5 is a simplified top view of a portion of an array architecture including a plurality of dual-bit memory cells in accordance with an exemplary embodiment.

FIG. 5 is a simplified top view of a portion 500 of an array architecture including a plurality of dual-bit memory cells in accordance with an exemplary embodiment. The array 500 has a "virtual ground layout" and comprises a plurality of bit lines 501-505, a plurality of word lines 508-572, a plurality of bit line contacts 580-595, and a plurality of trench isolation areas 576-577 between the bit line contacts 580-595 and a plurality of trench isolation areas 578 near the end of the bit lines 501-505. In the areas of the array 500 above the bit line contacts 580-595, there are no word lines present. The trench isolation areas 576-578 are provided to control, prevent or drastically reduce the likelihood of a leakage current flowing between adjacent bit lines 501-505 in the areas near or in the vicinity of the bit line contacts 580-595 and/or in the areas near or in the vicinity of the ends of the bit lines 501-505. The trench isolation regions 576-578 can be formed using any known techniques, such as, LOCalized Oxidation of Silicon (LOCOS) techniques or shallow trench isolation (STI) techniques. These techniques are known in art and will not be described further for sake of clarity.

It will be appreciated that the disclosed BL-to-BL isolation techniques can be applied to any BL spacing (or "channel length"), BL width, WL (or "channel") width, WL spacing (or "cell width"), and that the trench isolation depth can vary in any practical implementation. In one exemplary, non-limiting implementation, the BL spacing can be approximately 30 nm-1000 nm, the BL width (which with the BL spacing determines the cell length) can be approximately 30 nm-30 mm, the WL width can be approximately 30 nm-1000 nm, the WL spacing can be approximately 30 nm-1000 nm, the BL contact center to WL spacing can be approximately 100 nm-500 nm, BL contact size can be approximately 30 nm-500 nm, and the trench isolation depth can be between 10 nm-200 nm. It will be appreciated that these dimensions are merely exemplary in nature, and that these exemplary dimensions can vary within or outside (e.g., above or below) the ranges specified above.

Figure 6:
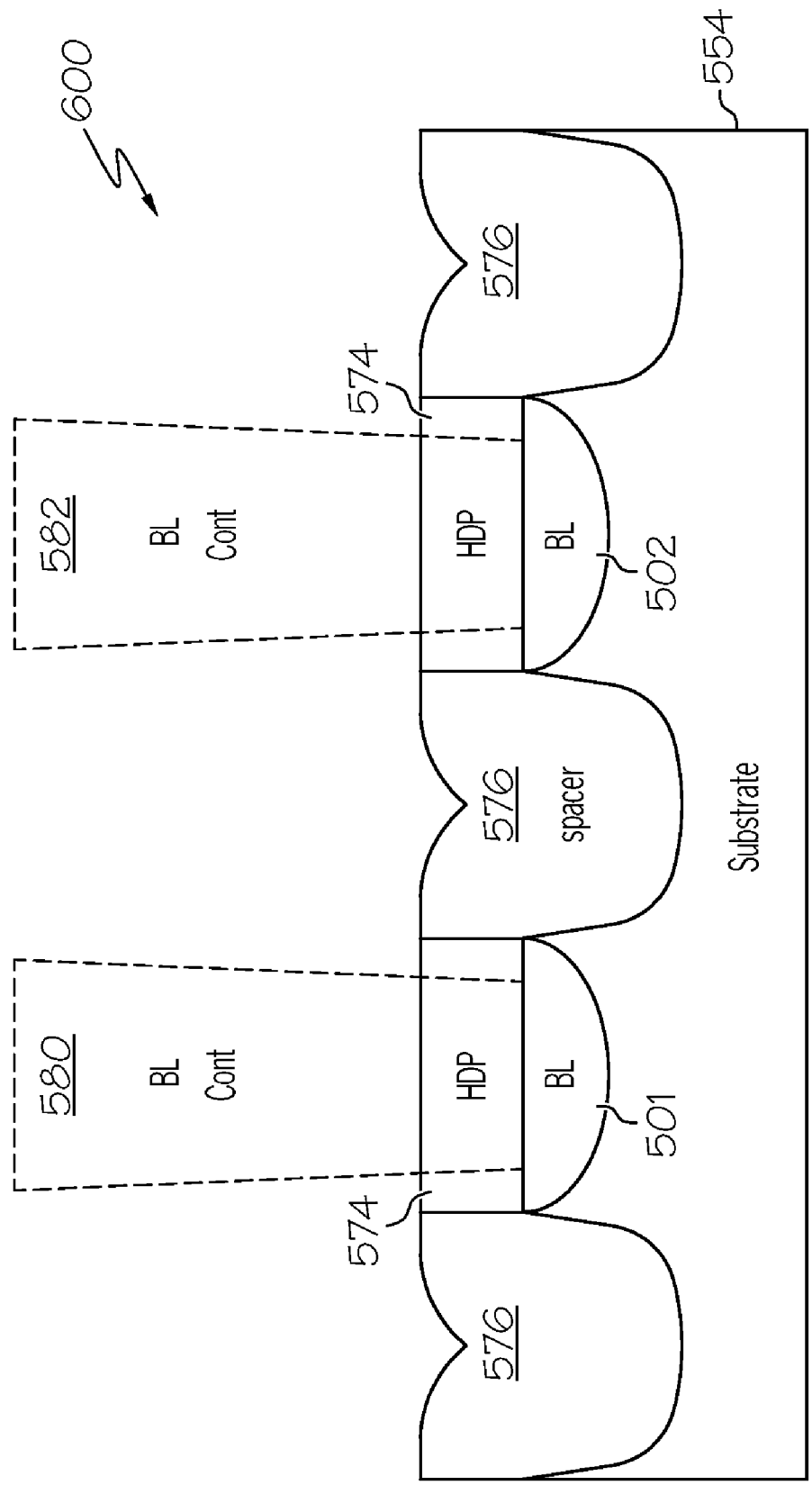
FIG. 6 is a simplified cross-sectional view of FIG. 5 taken along the line X-X' in accordance with an exemplary embodiment.

FIG. 6 is a simplified cross-sectional view of FIG. 5 taken along the line X-X' in accordance with an exemplary embodiment. The cross-section 600 includes a substrate 554, buried bit lines 501, 502, insulator regions 574, isolation trenches 576, and bit line contacts 580, 582. The isolation trenches 576 are formed in the substrate 554 to provide an obstacle which makes it more difficult for a leakage current to flow between the buried bit lines 501, 502. For a leakage current to flow between the bit lines 501, 502, the magnitude of a leakage current would have to be strong enough to flow underneath the trench 576. By making the isolation trenches 576 sufficiently deep, the isolation trenches 576 can effectively block the current path between adjacent bit lines 501, 502. As such, the configuration shown in FIG. 6 is less susceptible to and can prevent a leakage current flowing between the bit lines 501, 502.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of cells described in an exemplary embodiment without departing from the scope of the invention as set forth in the appended claims and their legal equivalents.

What is claimed is:

1. A semiconductor memory device, comprising:
a substrate;
a first buried bit line in the substrate;
a first bit line contact on the first buried bit line; and
a second buried bit line in the substrate;
a second bit line contact on the second buried bit line, wherein the second buried bit line is spaced apart from the first buried bit line; and
a plurality of insulator regions disposed in the substrate between the first buried bit line and the second buried bit line to prevent a current from flowing between the first buried bit line and the second buried bit line, wherein the plurality of insulator regions are substantially disposed between the first buried bit line and the second buried bit line only at the ends of the bit lines and between the first bit line contact and the second bit line contact, and wherein the plurality of insulator regions are disposed in the substrate only between buried bit lines.

2. A semiconductor memory device according to claim 1, wherein the plurality of insulator regions comprises:
a plurality of trench isolation regions disposed in the substrate between the first buried bit line and the second buried bit line only at the ends of the bit lines and between the first bit line contact and the second bit line contact, wherein the plurality of trenches are filled with an insulator material to prevent a leakage current from flowing between the first buried bit line and the second buried bit line.

3. A semiconductor memory device according to claim 1, further comprising:
a first insulator region disposed above the substrate over the first buried bit line, the first bit line contact extending through the first insulator region to the first buried bit line; and
a second insulator region disposed above the substrate over the second buried bit line, the second bit line contact extending through the second insulator region to the second buried bit line.

4. A semiconductor memory device according to claim 1, further comprising:
an insulating spacer disposed over the substrate between the first buried bit line and the second buried bit line.

5. A semiconductor memory device according to claim 2, wherein the plurality of trench isolation regions have a depth adequate to prevent a leakage current from flowing between the first buried bit line and the second buried bit line.

6. A semiconductor memory device according to claim 1, wherein the semiconductor memory device comprises a short channel semiconductor memory device, and wherein the second buried bit line is spaced apart from the first buried bit line by a distance less than or equal to 1000 nanometers.

7. A semiconductor memory device according to claim 2, wherein the plurality of trench isolation regions comprise an oxide.

8. A semiconductor memory device according to claim 2, wherein the plurality of trench isolation regions extend into the substrate between 10 nanometers and 200 nanometers.

9. A semiconductor memory device according to claim 7, wherein the plurality of trench isolation regions are formed using one of LOCalized Oxidation of Silicon (LOCOS) techniques and shallow trench isolation (STI) techniques.

10. A semiconductor memory device according to claim 6, wherein the second buried bit line is spaced apart from the first buried bit line by a distance of approximately 30-1000 nanometers.

* * * * *